United States Patent [19]

Solie

[11] Patent Number: 4,737,743

[45] Date of Patent: Apr. 12, 1988

[54] SINGLE MODE WAVEGUIDE SAW DISPERSIVE FILTER

[75] Inventor: Leland P. Solie, Mahomet, Ill.

[73] Assignee: Unisys Corporation, Blue Bell, Pa.

[21] Appl. No.: 65,984

[22] Filed: Jun. 24, 1987

[51] Int. Cl.[4] .................... H03H 9/145; H03H 9/42; H03H 9/64; H03H 9/44

[52] U.S. Cl. .................................. 333/153; 333/154; 333/195; 333/196

[58] Field of Search ............................... 333/150–155, 333/195–196; 310/313 R, 313 A, 313 B, 313 C, 313 D; 29/25.35

[56] References Cited

U.S. PATENT DOCUMENTS

| | | | |
|---|---|---|---|
| 3,568,102 | 3/1971 | Tseng | 333/153 |
| 3,753,164 | 8/1973 | DeVries | 333/153 |
| 3,882,430 | 5/1975 | Maerfeld | 333/153 |
| 3,883,831 | 5/1975 | Williamson et al. | 333/153 |
| 3,975,697 | 8/1976 | Paige | 310/313 D |
| 4,155,056 | 5/1979 | Cross et al. | 333/195 |
| 4,166,228 | 8/1979 | Solie | 310/313 D |
| 4,477,784 | 10/1984 | Maerfeld et al. | 333/154 |
| 4,521,751 | 6/1985 | Riha et al. | 333/151 |
| 4,635,008 | 1/1987 | Solie | 333/195 |

FOREIGN PATENT DOCUMENTS 1136309  1/1985  U.S.S.R. ............................ 333/195

Primary Examiner—Marvin L. Nussbaum
Attorney, Agent, or Firm—Glenn W. Bowen; Laurence J. Marhoefer

[57] ABSTRACT

A single mode waveguide dispersive surface acoustic wave (SAW) delay line is formed by aligning an elongated input transducer, which has a pattern of interdigital electrode fingers which launches a wideband SAW, with a beam compressor that feeds an input waveguide. The input SAW passes down the waveguide to a 3 dB coupler which extracts one-half of the power of the incoming SAW and feeds it in the direction opposite to the input wave. Both portions of the SAW are passed to dispersive reflective arrays along a folded path. A series of additional couplers and reflective dispersive arrays that form the folded path serve to further delay the SAW until it reaches a beam expander at the output end which feeds the SAW to an output transducer that is constructed in a manner similar or analogous to the input transducer.

13 Claims, 3 Drawing Sheets

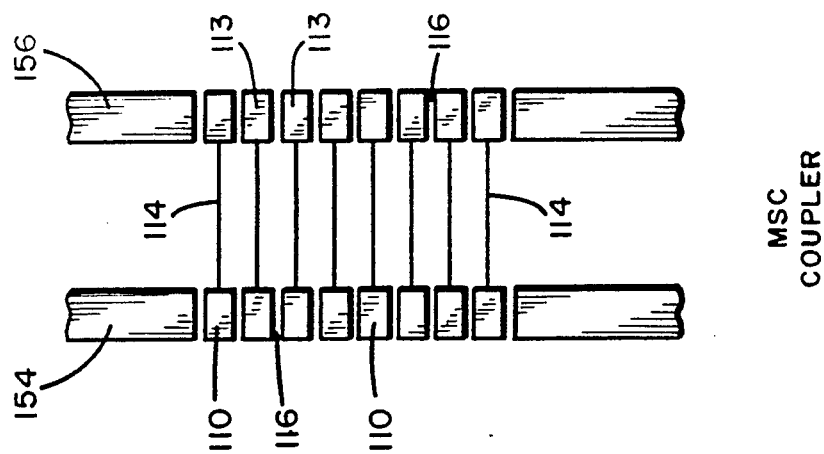
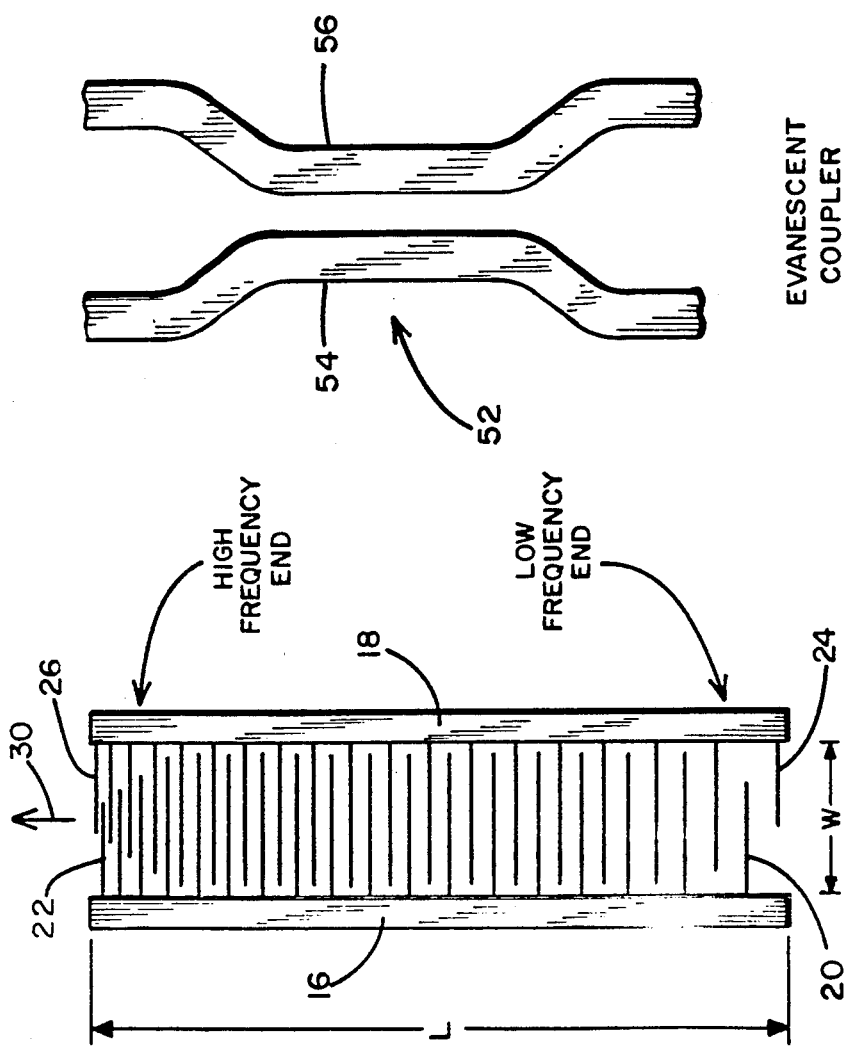

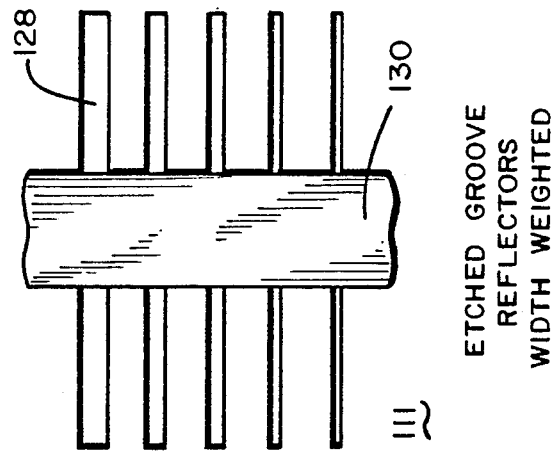
Fig. 4 ANODIZED METAL STRIP REFLECTORS
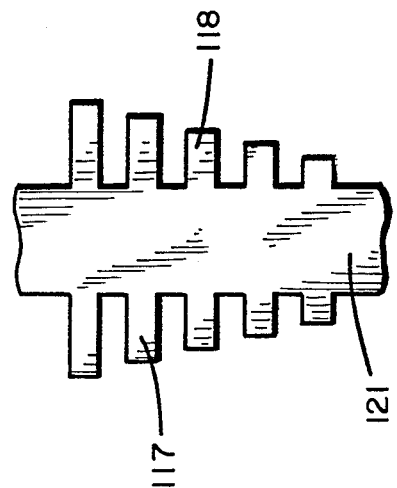
Fig. 5 ANODIZED SLOT REFLECTORS
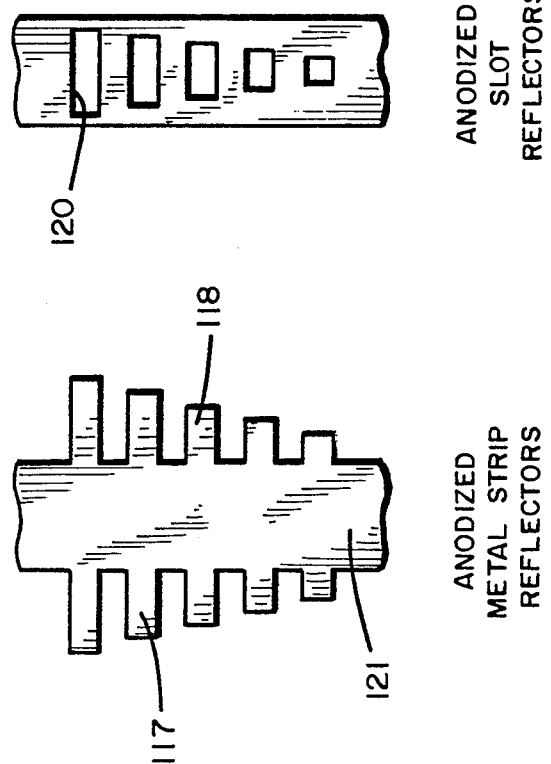
Fig. 6 ETCHED GROOVE REFLECTORS WIDTH WEIGHTED

SINGLE MODE WAVEGUIDE SAW DISPERSIVE FILTER

BACKGROUND OF THE INVENTION

There are applications in signal processing, and other areas, which could use dispersive surface acoustic wave (SAW) filters with very long time delays. The maximum delay of conventional dispersive delay lines is limited to about 30 microseconds using a standard size (4 inch) mask on standard size substrates (3 inch). Delays above 30 microseconds with SAW dispersive are possible, but the substrates become very expensive and construction of the device is very difficult. The present invention overcomes these limitations with a dispersive structure which uses a surface wave confined to a narrow, single-mode waveguide.

BRIEF DESCRIPTION OF THE DRAWINGS

The invention is described by reference to the drawings in which:

FIG. 2 is an enlarged top view of the input and output transducers of FIG. 1;

FIG. 3a is an enlarged top view of a coupler from FIG. 1;

FIG. 3b is an enlarged top view of an alternate waveguide coupler for use in FIG. 1;

FIG. 4 is an enlarged top view of a segment of the dispersive reflective array portion of the delay line of FIG. 1 which uses apodized metal strip reflectors;

FIG. 5 is an enlarged top view of a portion of the dispersive reflective array which uses apodized slot reflectors; and FIG. 6 is an enlarged top view of a portion of the dispersive reflective array of FIG. 1 which uses etched groove, width weighted reflectors.

TECHNICAL DESCRIPTION OF THE INVENTION

Figure 1:
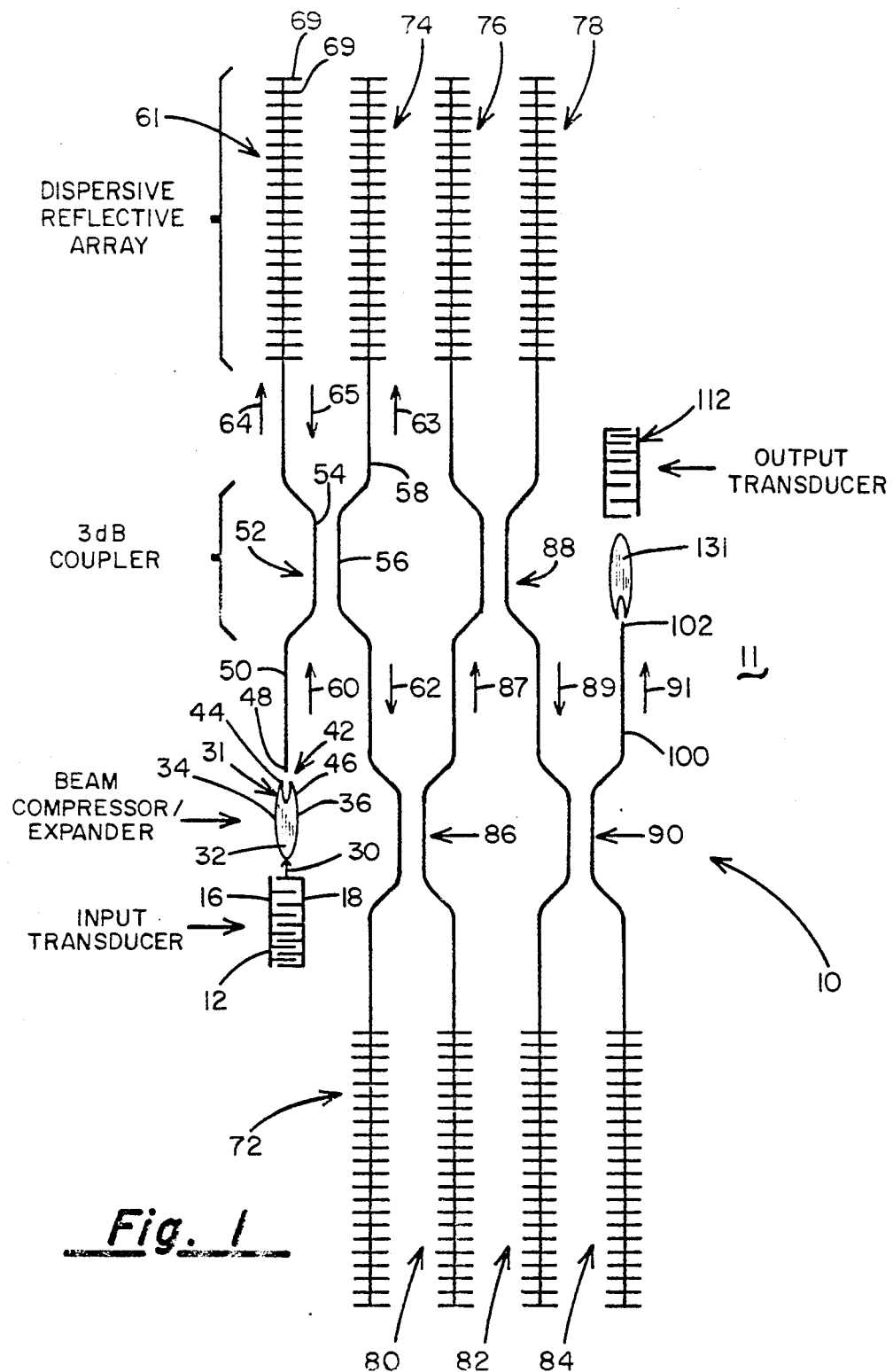
FIG. 1 represents a top view of the single mode waveguide dispersive delay line of the present invention.

The single mode waveguide dispersive delay line 10 of the present invention is illustrated in FIG. 1. Surface Acoustic Waves (SAWs) are generated by the dispersive input transducer 12, which is preferably an elongated transducer with a longitudinal dimension L aligned toward the beam compressor 31. The input transducer 12 is constructed with two relatively wide electrically conductive parallel electrode strips 16, 18 deposited on a suitable SAW conducting surface, such as a piezo-electric crystal. The electrode strips 16, 18 are connected to thinner numerous electrode fingers, such as the fingers 20, 22 (FIG. 2), and other fingers such as the fingers 24, 26 are connected to electrode strip 18. The fingers connected to the electrode strip 16 extend along the width dimension W toward the electrode fingers that are connected to the electrode strip 18, and they are spaced in an interdigital fashion. L is preferably several times greater than W.

Each finger is spaced from its neighboring electrode fingers. As shown in FIG. 2, which is an expanded view of the preferable construction of the transducer 12 of FIG. 1, the fingers nearest to the beam compressor are spaced closer together, such as the fingers 22, 26, than are those at the remote end, such as the fingers 20, 24. The spacing from finger-to-finger preferably varies in a substantially uniform, linear manner from the low frequency to the high frequency end. The fingers 22, 26, therefore, generate the highest frequency component of the resulting SAW, (the wave is indicated by the arrow 30), which travels toward the beam compressor 31, while the lowest frequency component is correspondingly produced by the wider spaced apart fingers 20, 24. The frequency components of the SAW traveling in the direction of the arrow 30 are thus determined by the spacing of the fingers along the longitudinal dimension L of the transducer 12. The orientation of the input transducer may be reversed so that the low frequency end is closer to the beam compressor than the high frequency end.

In a similar manner, the output transducer 112 may be positioned with either its low or high frequency end disposed toward the beam expander 131. The beam compressor 31 has an elongated electrode structure, of a generally elliptical shape, which is deposited on the surface 11. The sides 34, 36 of the beam compressor merge into a rounded end 32 which is adjacent the transducer 12 in the illustrated embodiment, and a concave centrally located curved section 42. There are two pointed, peninsular-like projections 44, 46 which are located adjacent the input end 48 of the rectangular waveguide 50. The waveguides of the delay line are deposited elongated electrically conductive strips that conduct the SAW from the input transducer 12 to the output transducer 112.

The coupler 52 consists of the inwardly curved segment 54 of the waveguide 50 and an inwardly curved segment 56 of an the adjacent SAW waveguide 58. The arrow 60 indicates the SAW wave after it has been compressed by the beam compressor 31 so that a high percentage of the energy of the SAW will be coupled into the waveguide 50. The compressed SAW beam when passed through the coupler 52 is thus partially coupled into the waveguide 58, and SAW components are established which travel in the waveguide 50, to form the combined SAWs indicated by the arrows 62, 63.

The portion of the compressed wave which is not coupled into the adjacent waveguide 58 continues on as shown by the arrow 64, into the dispersive reflective array section 61 of the delay line. FIG. 1 shows a dispersive reflective array element 66 as being constructed with a number of short, closely spaced parallel line segments 69 which cross the waveguide 50 at a substantially normal angle. The details of construction of suitable dispersive waveguide reflectors are shown in FIGS. 3, 4 and 5, and this is discussed in more detail subsequently. The function of the dispersive reflector array section 61 (see FIG. 3a) is to reflect a portion of the incoming wave indicated by the arrow 64 back again along the waveguide 50, (as indicated by the arrow 65). It is important to note that part of this reflected SAW component indicated by the arrow 65 will also be coupled again back into the coupler 52 and the waveguide 50. A portion of the SAW component shown by arrow 65 is also again coupled into the waveguide 58, and the SAW component indicated by arrow 62 travels into a second, or lower, section 72 of dispersive array elements. Similar SAW reflections occur in upper array sections 74, 76, 78 and in lower array sections 80, 82, 84. Coupling between adjacent waveguides, all of which except the input waveguide 50 and the output waveguide 100 are open ended at both ends, is achieved by the additional couplers 86, 88, 90.

The couplers are 3 dB couplers in which one-half of the incoming power is coupled to the waveguide adjacent to the waveguide carrying the incoming SAW on each pass of the SAW through it. If the incoming SAW component represented by the arrow 60, for example, has a magnitude of 1 and a phase angle of 0°, the amplitude of the SAW component after it has passed through the coupler 50 toward the reflective array section 61 will be 1 divided by $\sqrt{2}$, but it will still be at a phase angle 0°. Assuming no losses, the magnitude of the reflected SAW component from the dispersive reflective array section 68 will also be 1, and it will have a phase angle of 0°.

Any SAW component coupled into the waveguide 58 due to the incoming SAW 60 will have an amplitude of 1 divided by the $\sqrt{2}$ times the magnitude of the SAW on the other waveguide, and it will have a phase angle change of 90°, since this shift is a function of an evanescent coupler, such as the one shown in FIG. 1. The combined effect of this is to produce phase shifts of approximately 90° at each of the couplers 52, 86, 88 and 90, (i.e., the SAW component indicate by the arrows 62, 87, 89, 91 are at phase angles of 90°, 180°, 270° and 360° with respect to the phase angle of the SAW 60, and are approximately of the same magnitude. In the configuration shown in FIG. 1, where there are four couplers and five waveguides, therefore, there will be approximately a 360° phase shift, which achieves a transient delay time of the signal from the input transducer 12 to the output transducer 112 of one cycle time of the SAW.

A SAW, after leaving the output waveguide 100, travels to the beam expander 131, which is constructed in a manner similar to the beam compressor 31. It is also disposed in the illustrated embodiment so that the smaller, pointed ends of the concave lens face toward the output end 102 of the waveguide 100 upon being expanded, the output SAW travels to, and is received by, the output transducer 112. The beam compressor 31 and the beam expander 131 are both preferably employed, although it may be possible to provide a delay line in accordance with the teaching of the present invention without such elements depending on the construction, power, size of the input and output transducers and the construction of the waveguide.

In the illustrated embodiment of the dispersive delay line of the present invention, a surface wave is confined to a narrow single mode waveguide. Waveguide segments may be conveniently cascaded in parallel tracks placed approximately millimeter apart. In principle, on a 3-inch wafer it is possible to cascade up to 20 waveguide segments with 30 microseconds delay each, for a total dispersive delay of up to 600 microseconds. In the illustrated embodiment, a limited number of substantially parallel waveguides, except for the coupling area, and dispersive array elements are shown for ease of illustration.

A 600 microsecond delay using conventional reflective array technology would require a lithium niobate substrate approximately 1 meter long, which is at the present time impossible to produce. How much delay can be realized in practice with conventional techniques depends upon the loss of each cascaded section. In the single mode waveguide of the present invention neither the maximum delay nor the response will be limited appreciably by diffraction.

Although a particular input transducer has been disclosed, there are alternate ways of launching a narrow beam SAW wave into a waveguide, and any suitable method of launching such a beam, as known to those skilled in the art, may be employed in accordance with the present invention.

As described above, the 3 dB acoustic couplers are balanced in amplitude and have a 90° phase shift between the incoming SAW waveguide and the outgoing SAW in the old waveguide. The acoustic signal, therefore, propagates from the input to the output without internal reflections. If there is an error in amplitude, or phase, in the response of the coupler, a portion of the signal from the reflective array would return toward the input transducer. This would result in additional insertion loss and spurious signals that interfere with the desired signal. Although the evanescent coupling technique shown in the FIG. 3a is presently preferred, an alternate multiple segment coupler (MSC) which may be suitable for some applications is shown in FIG. 3b.

In contrast to the coupler of FIG. 3a in which the amount of coupling depends upon the spacing between the two guides and the length of the coupling region, the MSC of FIG. 2 is broken into short segments 110 along the left-hand electrode strip 154 and segments 113 along the right-hand electrode strip 156. These segments are each connected together by a very narrow strip electrodes 114, which form the coupling path between the segments, such as the segments 110 and 113. The gaps, such as the gaps 116, between the segments are much smaller than the segments and, therefore, the structure of FIG. 3b will also guide SAWs with minimal losses.

In regard to the dispersive reflective array sections, their function is to guide the wave in both the forward and reverse directions. These arrays, therefore must contain dispersive reflecting elements which reflect the fundamental frequency, or first mode, of any received signal into a first order mode SAW traveling in the opposite direction. This means that conversion of the signal into higher order waveguide modes and scattering out of the waveguide must be strictly minimized so that other surface waves, or bulk waves do not result. Techniques for accomplishing are shown in FIGS. 4, 5 and 6. periodic discontinuities projecting out of the waveguide, such as the tabs, which are each progressively slightly longer as the array is traversed from the receiving end to the output end of the waveguide.

A second method of obtaining the desired dispersive waveguide reflector uses apodized slots in the wave 120 instead of apodized tabs, as shown in FIG. 5. This technique has the advantage of being fabricatable in a single step, but it is more difficult with this configuration to prevent mode conversion into higher order modes or to other surface waves with such an arrangement.

Another technique for achieving the desired result is shown in FIG. 6, which uses grooves 128 that are etched into the substrate 111, and which run in a direction normal to the metallic waveguide 130. The grooves are width-weighted so that they become wider as the terminal end of the waveguide is approached. They are preferably continuous grooves which pass under a deposited metallic waveguide. This approach requires two fabrication steps, but alignment between the etched pattern and the waveguide can be off by several tenths of a micron without any substantial adverse effect on the response of the device. Furthermore, the etch depth may be constant for the device so that fabrication is relatively uncomplicated. The advantage of the technique of FIG. 6 is that there are essentially no mode conversion to undesirable modes.

While an illustrative embodiment of the present invention has been described and disclosed, the present invention may be implemented by alternate designs which will be apparent to those skilled in the art.

I claim:

1. A Surface Acoustic Wave (SAW) delay line comprising a SAW transmitting surface an input SAW generator means coupled to produce a wideband SAW on said surface, an output SAW receiving means coupled to receive said SAW on said surface and to convert said SAW into a signal, and a folded guided-wave path means comprising a plurality of elongated wave guide path means on said surface each having first and second linear sections each of which are terminated at one of the two opposite ends of the associated waveguide path means, said sections being aligned adjacent and parallel to each other so they run in the same general direction for conducting components of said SAW in said waveguide path means, one of the terminated ends of one waveguide path means comprising an input end of said delay line and another of the terminated ends of another waveguide path means comprising an output end of said delay line, a plurality of coupling means each located intermediate said linear sections of two adjacent waveguide path means for coupling approximately one-half of the power contained in a first SAW component traveling in one direction in one of said waveguide path means into an adjacent another one of said waveguide path means so that a coupled second SAW component of one-half of the power of said first SAW component is produced in said adjacent waveguide path means, and travels in an opposite direction to said first SAW component with a phase shift of approximately 90° with respect to said first SAW component, and dispersive array means disposed on the first and second linear sections of at least some of said first and second sections of said waveguide path means, which are constructed to reflect the SAW component traveling in a given direction in a particular waveguide path means back into a SAW component traveling in the opposite direction in the same waveguide path means, wherein said input generator means comprises an input transducer means and said output SAW receiving means comprises an output transducer means and both of said input and output transducer means are constructed with two electrodes deposited on said surface and a plurality of interdigitized conductive fingers that are connected to said electrodes, said input and output transducer means being constructed to have a length direction which is several times longer than a width direction of said transducer means, said conductive fingers of said input and output transducer means being aligned in a parallel fashion in the width direction and having a variable spacing from one finger connected to one electrode to the next adjacent finger connected to the other electrode, in which the alignment varies along said input and output transducer means in approximately a uniform manner from a larger spaced low frequency end to a smaller spaced high frequency end.

2. A SAW delay line as claimed in claim 1 wherein said input SAW generator means comprises input SAW transducer means and beam compressor means coupled between said input SAW transducer means and said input end, and said output SAW receiving means comprises an output SAW transducing means, a beam expander means coupled between said SAW output transducer means and said output end.

3. A SAW delay line as claimed in claim 1 wherein said plurality of coupler means comprise evanescent coupler means.

4. A SAW delay line as claimed in claim 3 wherein said dispersive array means comprise a plurality of apodized metal strip reflectors.

5. A SAW delay line as claimed in claim 3 wherein said dispersive array means comprise a plurality of apodized slot reflectors.

6. A SAW delay line as claimed in claim 3 wherein said dispersive array means comprise a plurality of etched grooved width-weighted reflectors.

7. A SAW delay line as claimed in claim 1 wherein said plurality of coupler means comprises a plurality of discontinuities along two adjacent waveguide path means and interconnecting means from each of the remaining continuous portions of said waveguide path means to one each of the remaining continuous portions of an adjacent waveguide path means.

8. A SAW delay line as claimed in claim 7 wherein said array means comprise a plurality of apodized metal strip reflectors.

9. A SAW delay line as claimed in claim 7 wherein said dispersive array means comprise a plurality of apodized slot reflectors.

10. A SAW delay line as claimed in claim 7 wherein said dispersive array means comprises a plurality of etched grooved width-weighted reflectors.

11. A SAW delay line as claimed in claim 1 wherein said dispersive array means comprise a plurality of apodized metal strip reflectors.

12. A SAW delay line as claimed in claim 1 wherein said dispersive array means comprise a plurality of apodized slot reflectors.

13. A SAW delay line as claimed in claim 1 wherein said dispersive array means comprise a plurality of etched groove width-weighted reflectors.

* * * * *

UNITED STATES PATENT AND TRADEMARK OFFICE
CERTIFICATE OF CORRECTION

PATENT NO. : 4,737,743
DATED : 4/12/88
INVENTOR(S) : Leland P. Solie

It is certified that error appears in the above-identified patent and that said Letters Patent are hereby corrected as shown below:

IN THE PRINTED PATENT:

Column 4, line 42, begin a new paragraph and before "periodic" insert -- Fig. 4 shows an all metallic waveguide formed of conductive material deposited on the surface n with -- .

Signed and Sealed this

Sixteenth Day of August, 1988

Attest:

DONALD J. QUIGG

Attesting Officer   Commissioner of Patents and Trademarks